(12) United States Patent
Kim et al.

(10) Patent No.: US 12,740,320 B2
(45) Date of Patent: Sep. 15, 2026

(54) MASS FABRICATION METHOD FOR A SPACER INSERTED THERMOELECTRIC DEVICE

(71) Applicant: Industry-Academic Cooperation Foundation, YONSEI UNIVERSITY, Seoul (KR)

(72) Inventors: Woochul Kim, Seoul (KR); Sungjin Park, Seoul (KR); Yousung Choi, Seoul (KR)

(73) Assignee: Industry-Academic Cooperation Foundation, YONSEI UNIVERSITY, Seoul (KR)

( * ) Notice: Subject to any disclaimer, the term of this patent is extended or adjusted under 35 U.S.C. 154(b) by 83 days.

(21) Appl. No.: 18/769,867

(22) Filed: Jul. 11, 2024

(65) Prior Publication Data

US 2025/0127059 A1 Apr. 17, 2025

(30) Foreign Application Priority Data

Oct. 12, 2023 (KR) ........................ 10-2023-0135979

(51) Int. Cl.
*H10N 10/01* (2023.01)
*H10N 10/817* (2023.01)

(52) U.S. Cl.
CPC ........... *H10N 10/01* (2023.02); *H10N 10/817* (2023.02)

(58) Field of Classification Search
CPC .............................................. H10N 10/00–857
USPC .................................................. 136/200–242
See application file for complete search history.

(56) References Cited

U.S. PATENT DOCUMENTS 5,969,290 A * 10/1999 Kagawa ................. H10N 10/17 136/203
2019/0097115 A1* 3/2019 Tomida .................. H10N 10/01

FOREIGN PATENT DOCUMENTS

| | | | | |
|---|---|---|---|---|
| KR | 10-1152222 B1 | 6/2012 | | |
| KR | 10-2013-0087730 A | 8/2013 | | |
| KR | 101470393 B1 * | 12/2014 | | H10N 10/17 |
| KR | 10-2018-0055227 A | 5/2018 | | |
| KR | 10-2020-0134680 A | 12/2020 | | |
| KR | 20210112887 A * | 9/2021 | | H01L 35/34 |

OTHER PUBLICATIONS

KR-101470393-B1 English (Year: 2014).*
KR-20210112887-A English (Year: 2021).*

* cited by examiner

*Primary Examiner* — Bach T Dinh
(74) *Attorney, Agent, or Firm* — Bridgeway IP Law Group, PLLC; Jihun Kim

(57) ABSTRACT

An embodiment provides a mass-manufacturing method of new structure thermoelectric elements, including: (a) filling a thermoelectric material powder so as to surround the inner and outer parts of a spacer portion located inside a mold portion; (b) pressurizing the spacer portion by a punch portion; (c) sintering the thermoelectric material powder using spark plasma to produce a sintered body; and (d) cutting the sintered body to a preset size to manufacture a plurality of thermoelectric elements.

5 Claims, 16 Drawing Sheets

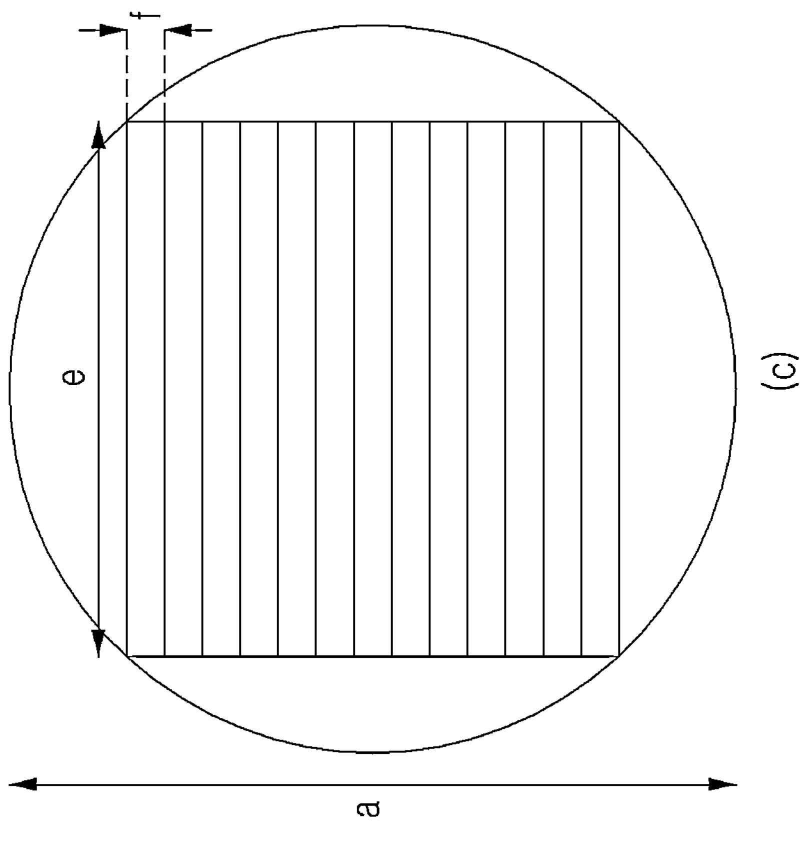
FIG. 15
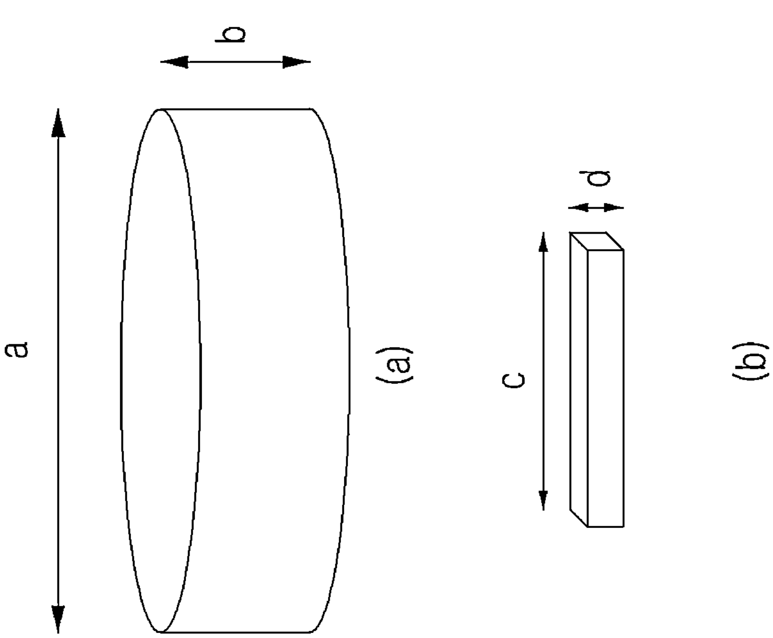

MASS FABRICATION METHOD FOR A SPACER INSERTED THERMOELECTRIC DEVICE

CROSS-REFERENCE TO RELATED APPLICATIONS

This application claims priority from Korean Patent Application No. 10-2023-0135979, filed on Oct. 12, 2023, in the Korean Intellectual Property Office, which is incorporated herein by reference in its entirety.

BACKGROUND

The disclosure relates to a mass-manufacturing method of new structure thermoelectric elements, and more specifically, to a mass-manufacturing method of new structure thermoelectric elements, wherein thermoelectric elements are manufactured in mass quantities while reducing manufacturing costs by mixing a thermoelectric material powder and a spacer portion.

A thermoelectric element is classified as one type of energy harvesting devices. A thermoelectric element typically includes a heat source, a heat sink, and a thermocouple array. A thermocouple array is composed of a plurality of thermocouples connected in series and is used to convert a portion of thermal energy into energy.

A thermoelectric element is typically formed using a semiconductor material. Semiconductor materials are electrically connected in series and thermally connected in parallel to form a thermocouple, forming two junctions. The semiconductor materials are typically N-type and P-type, and in a typical thermoelectric device, an electrically conductive connection is formed between P-type and N-type semiconductor materials, and carriers move from a hot junction to a cold junction as a result of heat diffusion, thereby inducing a current.

FIGS. 1A and 1B are perspective views from one direction showing a configuration for manufacturing a sintered body according to a related art and a sintered body.

According to the related art illustrated in FIGS. 1A and 1B, a sintered body is manufactured using an SPS device, and then cut to a predetermined size to manufacture a thermoelectric element.

Specifically, referring to FIG. 1A, a molding portion 10 included in an SPS device includes a molding 11, a punch 12 including a first punch 12*a* and a second punch 12*b* respectively positioned at the upper and lower parts of the molding 11, a sheet 13 including a first sheet 13*a* positioned at the lower part of the first punch 12*a* and a second sheet 13*b* positioned at the upper part of the second punch 12*b*, and a spacer 14 positioned between the first and second sheets 13*a*, 13*b*.

Referring to FIG. 1B, the diameter a of a sintered body manufactured by the above-mentioned conventional technology is 12 cm to 15 cm, the height b of the sintered body is 2 cm to 3 cm, and the weight of the sintered body is 2 kg to 2.5 kg.

However, the above-mentioned conventional technology is disadvantageous in terms of cost since the sintered body is made entirely of a thermoelectric material, and there is a problem that the outer portion must be discarded during cutting since the sintered body is formed in a circular shape.

(Patent Document 1) Republic of Korea Patent Registration Publication No. 1152222 (May 25, 2012)

SUMMARY

The disclosure is to provide a mass-manufacturing method of new structure thermoelectric elements, including mixing a thermoelectric material powder and a spacer portion, sintering the mixture using an SPS device to produce a sintered body, and cutting the produced sintered body to mass-manufacture thermoelectric elements in a single process.

The aspect of the disclosure is not limited to that mentioned above, and other aspects not mentioned will be clearly understood by those skilled in the art from the description below.

The disclosure provides a mass-manufacturing method of new structure thermoelectric elements, including: (a) filling a thermoelectric material powder so as to surround the inner and outer parts of a spacer portion located inside a mold portion; (b) pressurizing the spacer portion by a punch portion; (c) sintering the thermoelectric material powder using spark plasma to produce a sintered body; and (d) cutting the sintered body to a preset size to manufacture a plurality of thermoelectric elements.

In addition, the disclosure provides a mass-manufacturing method of new structure thermoelectric elements, including: (a) filling a thermoelectric material powder to surround the inner and outer parts of a plurality of spacer portions located inside a mold portion; (b) pressurizing, by a punch portion, the plurality of spacer portions; (c) sintering, by a spark plasma sintering device, the thermoelectric material powder using spark plasma to generate a plurality of sintered bodies; and (d) cutting the plurality of sintered bodies to a preset size to manufacture a plurality of thermoelectric elements.

In an embodiment of the disclosure, (a) may include: (a1) inserting the upper part of a lower punch provided in the punch portion into the mold portion; (a2) supplying the thermoelectric material powder to the upper surface of the lower punch; (a3) placing the spacer portion on the upper part of thermoelectric material powder supplied to the upper surface of the lower punch; (a4) supplying the thermoelectric element powder into the mold portion; and (a5) inserting the lower part of the upper punch provided in the punch portion into the mold portion.

In an embodiment of the disclosure, (a) may include: (a1) inserting the upper part of a lower punch provided in the punch portion into the mold portion; (a2) placing one of a plurality of sheet portions on the upper part of the lower punch; (a3) supplying the thermoelectric material powder to the upper surface of one of the sheet portions; (a4) placing the spacer portion on the upper part of the thermoelectric material powder supplied to the upper surface of one of the sheet portions; (a5) supplying the thermoelectric element powder into the mold portion; (a6) placing another of the plurality of sheet portions on the upper part of the spacer portion; and (a7) inserting the lower part of the upper punch provided in the punch portion into the mold portion.

In an embodiment of the disclosure, in (a4), the spacer portion may have a rectangular hexahedron shape that extends in one direction, and in (a4), the thermoelectric element powder may be supplied into the mold portion to surround the spacer portion.

In an embodiment of the disclosure, in (a4), the spacer portion may include: a plurality of horizontal spacers that are arranged to be lengthily extended in the horizontal direction and spaced apart from each other in the vertical direction; and a pair of vertical spacers that are lengthily extended in the vertical direction and respectively formed at ends of the plurality of horizontal spacers, and in (a5), the thermoelectric material powder may be supplied into the mold portion, thereby filling a plurality of slits formed between the plurality of horizontal spacers and the pair of vertical spacers and surrounding the spacer portion.

In an embodiment of the disclosure, (a) may include: (a1) supplying the thermoelectric material powder into a spacer portion located at the lowermost position after the spacer portion located at the lowermost position among the plurality of spacer portions is located at the upper part of the lower punch provided in the punch portion; (a2) supplying the thermoelectric material powder into an n-layer spacer portion after the n-layer spacer portion among the plurality of spacer portions is placed at the upper part of the spacer portion located at the lowermost position; and (a3) supplying the thermoelectric material powder into a spacer portion located at the uppermost position after the spacer portion located at the uppermost position among the plurality of spacer portions is placed at the upper part of the n-layer spacer portion.

In an embodiment of the disclosure, (a1) may include: (a11) placing a sheet portion located at the lowermost position among the plurality of sheet portions at the upper part of the lower punch; (a12) supplying the thermoelectric material powder to the upper part of the sheet portion located at the lowermost position; (a13) placing the spacer portion located at the lowermost position at the upper part of the thermoelectric material powder supplied to the upper part of the sheet portion located at the lowermost position; (a14) supplying the thermoelectric material powder to the upper part of the spacer portion located at the lowermost position; (a15) placing one sheet portion among the plurality of sheet portions at the upper part of the thermoelectric material powder supplied to the upper part of the spacer portion located at the lowermost position; and (a16) placing an n-layer support portion among the plurality of support portions at the upper part of the one sheet portion. In an embodiment of the disclosure, (a2) may include: (a21) placing an n-layer sheet portion among the plurality of sheet portions on the upper part of the n-layer support portion; (a22) supplying the thermoelectric material powder to the upper part of the n-layer sheet portion; (a23) placing an n-layer spacer portion among the plurality of spacer portions on the upper part of the thermoelectric element powder supplied to the upper part of the n-layer sheet portion; and (a24) supplying the thermoelectric material powder to the upper part of the n-layer spacer portion, wherein (a21) to (a24) are repeatedly performed until a preset number of times becomes n (here, n=natural number).

In an embodiment of the disclosure, (a3) may include: (a31) placing another sheet portion among the plurality of sheet portions on the upper part of the thermoelectric material powder supplied to the upper part of the n-layer spacer portion; (a32) supplying the thermoelectric material powder to the upper part of the other sheet portion; (a33) placing a spacer portion located at the uppermost position among the plurality of spacer portions on the upper part of the thermoelectric material powder supplied to the upper part of the other sheet portion; (a34) supplying the thermoelectric material powder to the upper part of the spacer portion located at the uppermost position; (a35) placing a sheet portion located at the uppermost position among the plurality of sheet portions on the upper part of the thermoelectric material powder supplied to the upper part of the spacer portion located at the uppermost position; and (a36) placing an upper punch provided in the punch portion on the upper part of the sheet portion located at the uppermost position.

In an embodiment of the disclosure, the method may further include, between (c) and (d), taking out the plurality of sintered bodies sintered inside the mold portion after the upper punch and the lower punch provided in the punch portion move upward and downward to be separated from the mold portion.

In an embodiment of the disclosure, the method may further include, between (c) and (d), taking out the sintered body sintered inside the mold portion after the upper punch and the lower punch move upward and downward to be separated from the mold portion.

In an embodiment of the disclosure, (d) may include: (d1) cutting both sides of the plurality of sintered bodies in the vertical direction; (d2) cutting the plurality of sintered bodies in the horizontal direction while maintaining a predetermined gap in the vertical direction; (d3) cutting the plurality of sintered bodies in the vertical direction while maintaining a predetermined gap in the horizontal direction; and (d4) manufacturing the plurality of thermoelectric elements.

In an embodiment of the disclosure, (d) may include: (d1) cutting the sintered body in the vertical direction while maintaining a predetermined gap in the horizontal direction; and (d2) manufacturing the plurality of thermoelectric elements.

In an embodiment of the disclosure, (d) may include: (d1) cutting both sides of the sintered body in the vertical direction; (d2) cutting the sintered body in the horizontal direction while maintaining a predetermined gap in the vertical direction; (d3) cutting the sintered body in the vertical direction while maintaining a predetermined gap in the horizontal direction; and (d4) manufacturing the plurality of thermoelectric elements.

In addition, the disclosure provides a new structure thermoelectric element manufactured by the mass-manufacturing method of new structure thermoelectric elements as described above, the new structure thermoelectric element including: a hexahedral spacer; and a thermoelectric material surrounding four of the six faces of the spacer, excluding two faces facing each other, wherein the two faces facing each other of the spacer are exposed to the outside.

The effects of the disclosure are that a sintered body is generated by mixing a thermoelectric material powder and a spacer portion to be then sintered using an SPS device, and it is possible to mass-manufacture thermoelectric elements in a single process by cutting the generated sintered body, and reduce the production cost by reducing the content of the thermoelectric material powder.

The effects of the disclosure are not limited to the effects described above, and should be understood to include all effects that are inferable from the configuration of the disclosure described in the detailed description or claims of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 15 includes perspective views from one direction showing the sizes of a sintered body manufactured by a conventional technology and a sintered body manufactured by a mass-manufacturing method of new structure thermoelectric elements according to first to third embodiments of the disclosure.

DETAILED DESCRIPTION

Figure 1:
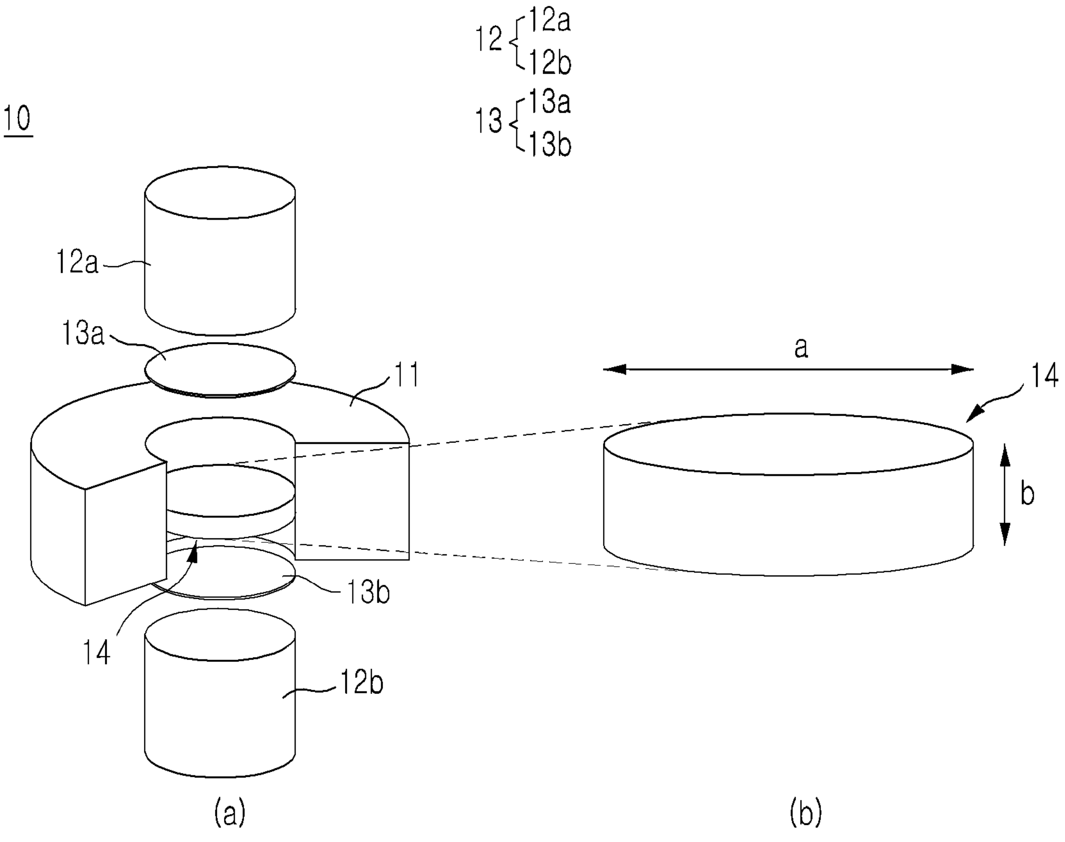
FIG. 1 includes perspective views from one direction showing a configuration for manufacturing a sintered body according to a related art and a sintered body.

Hereinafter, the disclosure will be described with reference to the accompanying drawings. However, the disclosure may be implemented in various different forms and, therefore, is not limited to the embodiments described herein. In order to clearly explain the disclosure in the drawings, portions unrelated to the description are omitted, and similar portions are given similar reference numerals throughout the specification.

Throughout the specification, when a portion is said to be "connected (linked, contacted, combined)" with another portion, this includes not only a case of being "directly connected" but also a case of being "indirectly connected" with another member in between. In addition, when a portion is said to "include" a certain component, this does not mean that other components are excluded, but that other components may be added, unless specifically stated to the contrary.

The terms used herein are merely used to describe specific embodiments and are not intended to limit the disclosure. Singular expressions include plural expressions unless the context clearly dictates otherwise. In this specification, it should be understood terms such as "include" or "have" are to designate the presence of features, numbers, steps, operations, components, parts, or combinations thereof described in the specification, but are not to exclude in advance the possibility of the presence or addition of one or more other features, numbers, steps, operations, components, parts, or combinations thereof.

Hereinafter, embodiments of the disclosure will be described in detail with reference to the accompanying drawings.

1. Mass-Manufacturing Method of New Structure Thermoelectric Elements

1-1. First Embodiment (Application of One Spacer Portion Having a Rectangular Parallelepiped Shape)

Hereinafter, a mass-manufacturing method of new structure thermoelectric elements according to the first embodiment of the disclosure will be described with reference to FIGS. 2 to 4F, and a mold device for manufacturing a new structure thermoelectric element and an SPS device including the same will be briefly described.

The mold device 100 includes a mold portion 110, a punch portion 120, and a spacer portion 140.

Here, the mold portion 110 may be a carbon mold.

The punch portion 120 includes an upper punch 121 and a lower punch 122.

The mold device 100 described above is included in an SPS device 200.

Figure 2:
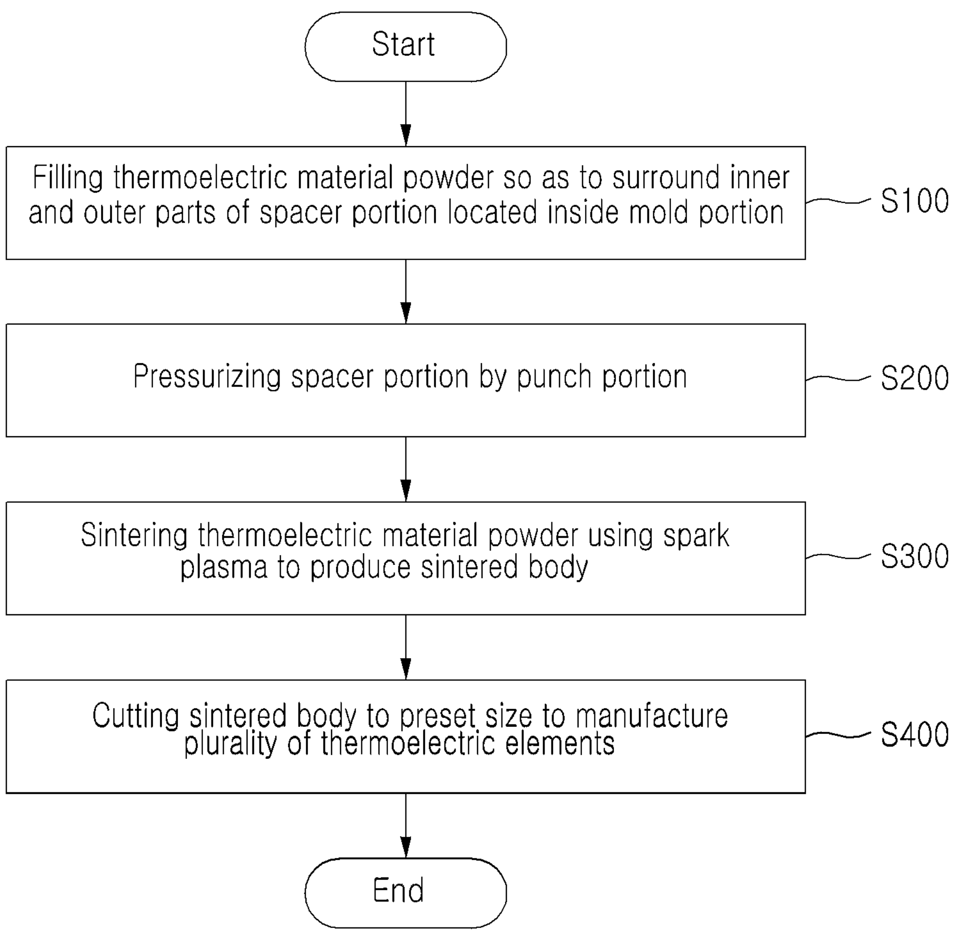
FIG. 2 is a flow chart showing a mass-manufacturing method of new structure thermoelectric elements according to first and second embodiments of the disclosure.
Figure 3:
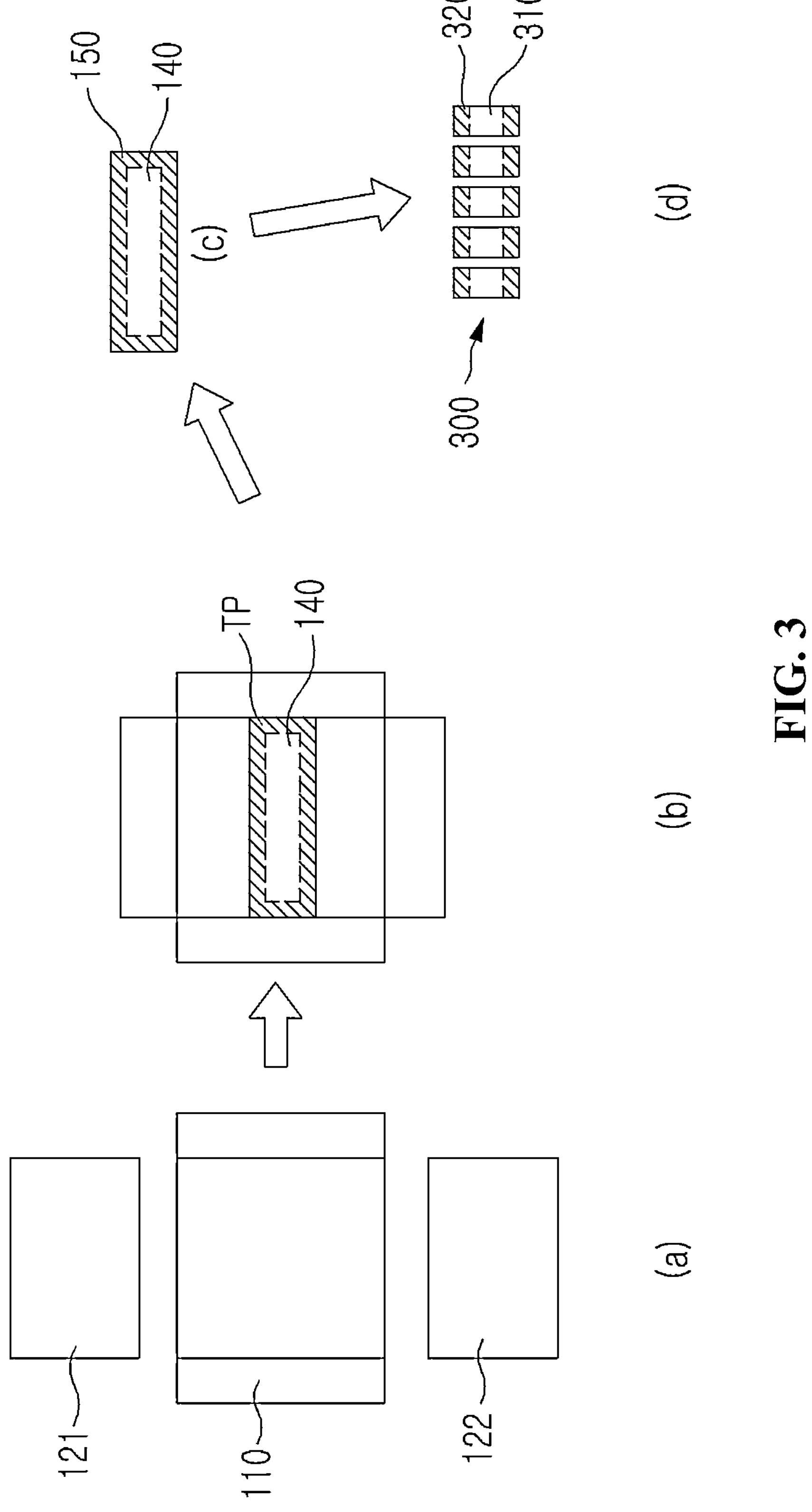
FIG. 3 is a process flow diagram conceptually showing detailed processes of a mass-manufacturing method of new structure thermoelectric elements according to a first embodiment of the disclosure.
Figure 4:
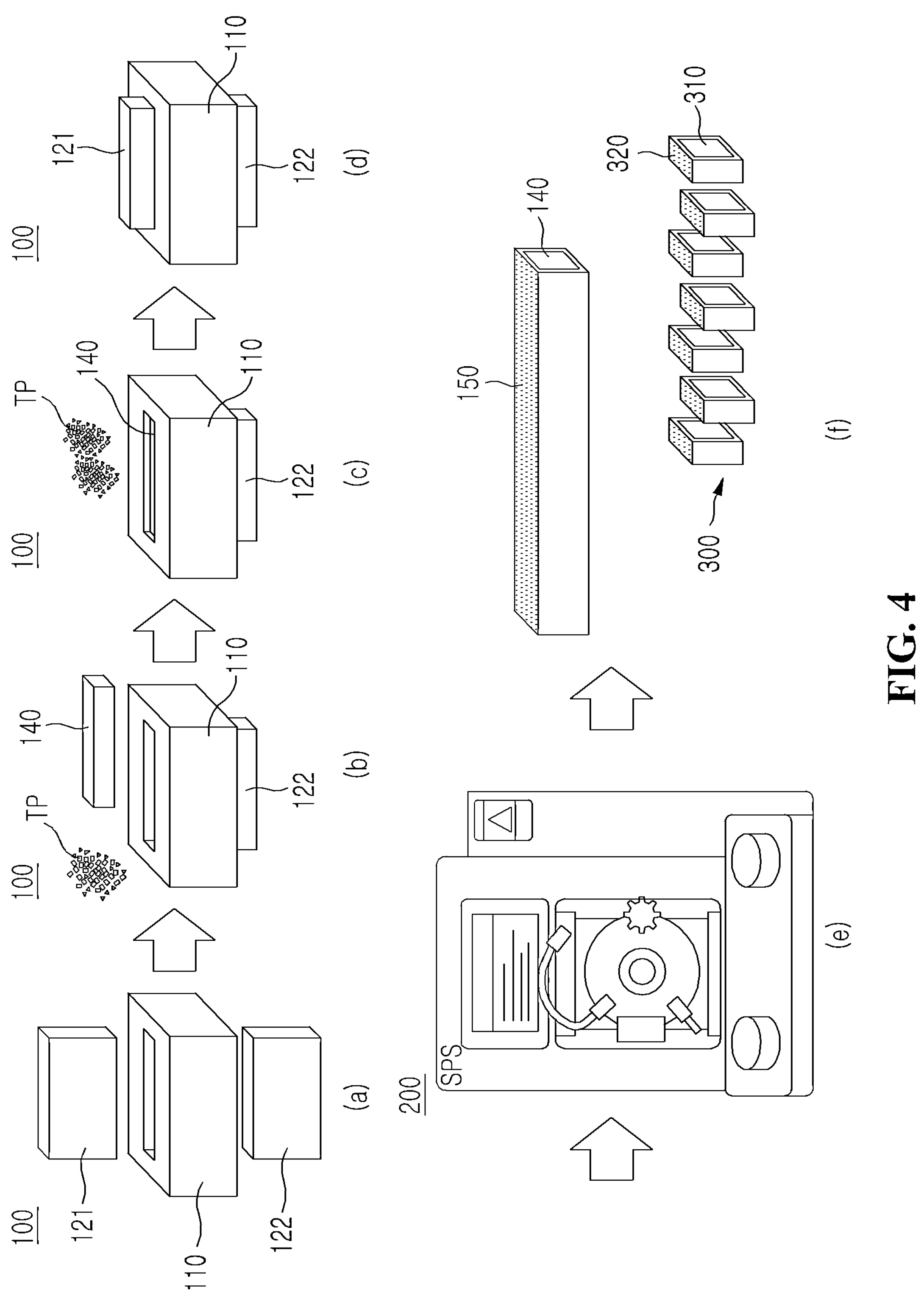
FIG. 4 is a process flow diagram showing detailed processes of a mass-manufacturing method of a new structure thermoelectric element according to a first embodiment of the disclosure.
Figure 5:
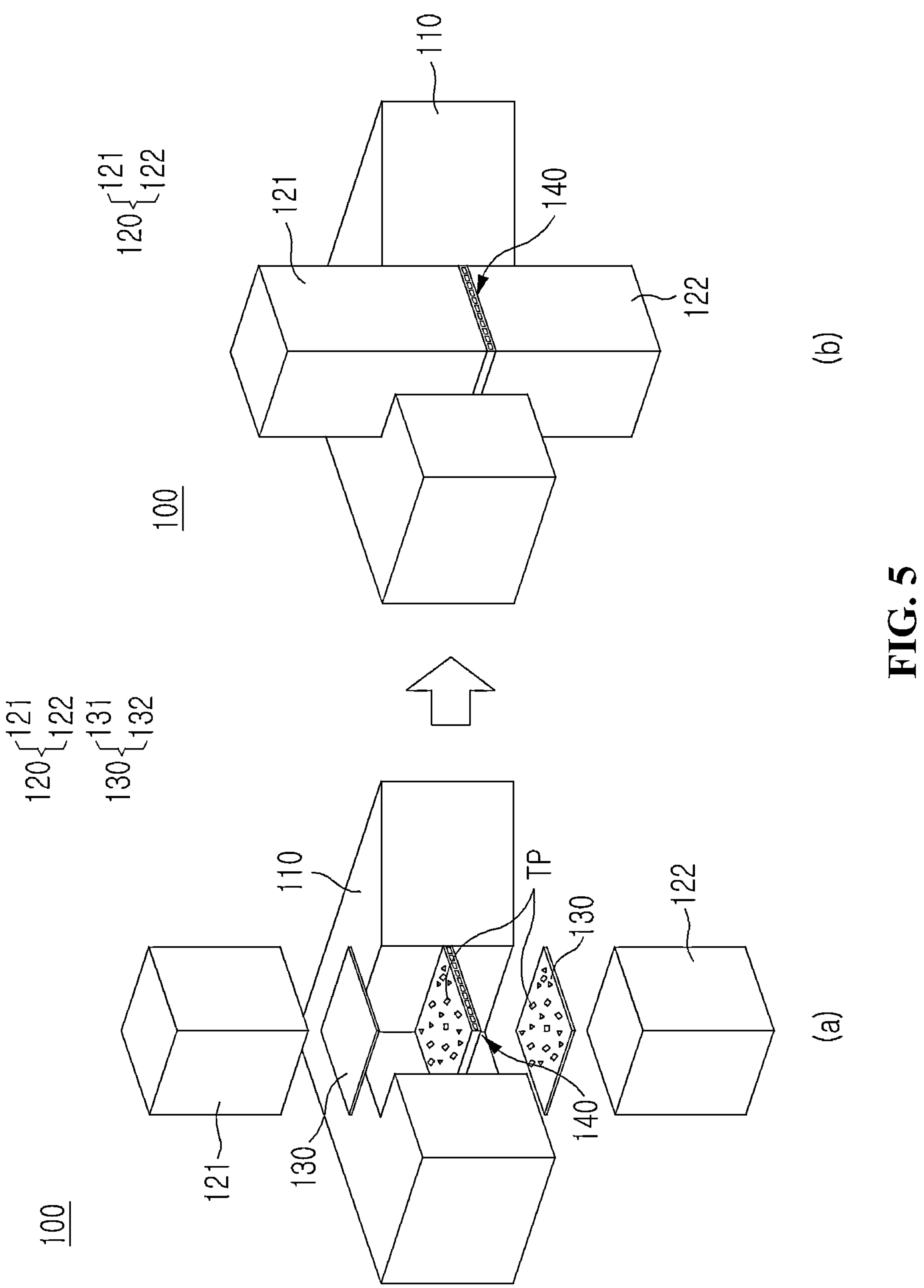
FIG. 5 includes perspective views from one direction showing a mold device for performing a mass-manufacturing method of new structure thermoelectric elements according to a second embodiment of the disclosure.

FIG. 2 is a flow chart showing a mass-manufacturing method of new structure thermoelectric elements according to first and second embodiments of the disclosure. FIGS. 3A, 3B, 3C, and 3D are each a part of a process flow diagram conceptually showing detailed processes of a mass-manufacturing method of new structure thermoelectric elements according to a first embodiment of the disclosure.

Referring to FIGS. 2, 3A, 3B, 3C, and 3D, a mass-manufacturing method of new structure thermoelectric elements according to the first embodiment of the disclosure includes: (a) filling a thermoelectric material powder TP in a spacer portion 140 located inside a mold portion 110; (b) pressurizing the spacer portion 140 by a punch portion 120 (S200); (c) sintering the thermoelectric material powder TP using spark plasma to produce a sintered body 140, 150; and (d) cutting the sintered body to a preset size to manufacture a plurality of thermoelectric elements 300.

FIGS. 4A, 4B, 4C, 4D, 4E, and 4F are each a part of a process flow diagram showing detailed processes of a mass-manufacturing method of a new structure thermoelectric element according to a first embodiment of the disclosure.

(a) includes: (a1) inserting the upper part of a lower punch 122 provided in the punch portion 120 into the mold portion 110; (a2) supplying the thermoelectric material powder TP to the upper surface of the lower punch 122; (a3) placing the spacer portion 140 on the upper part of thermoelectric material powder TP supplied to the upper surface of the lower punch 122; (a4) supplying the thermoelectric element powder TP into the mold portion 110; and (a5) inserting the lower part of the upper punch 121 provided in the punch portion 120 into the mold portion 110.

For example, the mold portion 110 may be a carbon mold.

Referring to FIG. 3A and FIG. 4A, in (a), the upper part of the lower punch 122 is inserted into the mold portion 110. At this time, the inside of the mold portion 110 is formed to correspond to the spacer portion 140.

Next, referring to FIG. 4B, in (a2), a thermoelectric material powder TP is supplied to the upper surface of the lower punch 122.

Next, referring to FIGS. 4B and 4C, in (a3), the spacer portion 140 is disposed on the upper part of the thermoelectric material powder TP supplied to the upper surface of the lower punch 122, and accordingly, the spacer portion 140 is located inside the mold portion 110.

Next, in (a4), the spacer portion 140 may have a rectangular parallelepiped shape extending long in one direction.

Referring to FIGS. 3B and 4C, in (a4), a thermoelectric element powder TP is supplied into the mold portion 110 to surround the spacer portion 140.

Next, referring to FIG. 3B and FIG. 4D, in (a5), the lower part of the upper punch 121 provided in the punch portion 120 is inserted into the mold portion 110.

Next, referring to FIG. 3B and FIG. 4B, (b) includes: (b1) moving the lower punch 122 upward; (b2) moving the upper punch 121 downward; and (b3) pressurizing, by the upper punch 121 and the lower punch 122, the thermoelectric material powder TP and the spacer portion 140.

Next, referring to FIG. 4E, in (c), the SPS device 200 provides spark plasma to the mold device 100 to sinter the thermoelectric material powder TP, thereby producing the sintered bodies 140, 150 shown in the upper part of FIG. 3C and FIG. 4F are created.

Here, the sintered bodies 140 and 150 include the spacer portion 140 and the thermoelectric material portion 150 surrounding the spacer portion 140.

Next, the disclosure further includes, between (c) and (d), taking out the sintered bodies 140, 150 sintered inside the mold portion 110 after the upper punch 121 and the lower punch 122 move upward and downward to be separated from the mold portion 110.

Next, referring to FIG. 3D and FIG. 4F, (d) includes: (d1) cutting the sintered bodies 140, 150 in the vertical direction while maintaining a predetermined gap in the horizontal direction; and (d2) manufacturing the plurality of thermoelectric elements 300.

The thermoelectric elements 300 include the spacer 310 in which the spacer portion 140 is cut and the thermoelectric material 320 in which the thermoelectric material portion 150 is cut.

1-2. Second Embodiment (Application of One Spacer Portion with Multiple Slits Formed)

Hereinafter, a mass-manufacturing method of new structure thermoelectric elements according to a second embodiment of the disclosure will be described with reference to FIGS. 2 to 10, and a mold device for manufacturing a new structure thermoelectric element and an SPS device including the same will be briefly described.

FIGS. 5A and 5B are perspective views from one direction showing a mold device for performing a mass-manufacturing method of new structure thermoelectric elements according to a second embodiment of the disclosure.

Referring to FIGS. 5A and 5B, the mold device 100 includes a mold portion 110, a punch portion 120, a sheet portion 130, and a spacer portion 140.

The mold device 100 described above is included in an SPS device 200.

Here, the mold portion 110 may be a carbon mold.

The punch portion 120 includes an upper punch 121 and a lower punch 122.

The spacer portion 140 includes a horizontal spacer 141 and a vertical spacer 142.

Referring to FIG. 2, a mass-manufacturing method of new structure thermoelectric elements according to a second embodiment of the disclosure may include: (a) filling a thermoelectric material powder TP in a spacer portion 140 located inside a mold portion 110; (b) pressurizing, by a punch portion 120, the spacer portion 140; (c) sintering the thermoelectric material powder TP using spark plasma to produce a sintered body 140, 150; and (d) cutting the sintered body to a preset size to manufacture a plurality of thermoelectric elements 300.

Referring to FIG. 5A, (a) includes: (a1) inserting the upper part of a lower punch 122 provided in the punch portion 120 into the mold portion 110; (a2) placing one of a plurality of sheet portions 130 on the upper part of the lower punch 122; (a3) supplying the thermoelectric material powder TP to the upper surface of one of the sheet portions 130; (a4) placing the spacer portion 140 on the upper part of the thermoelectric material powder TP supplied to the upper surface of one of the sheet portions 130; (a5) supplying the thermoelectric element powder TP into the mold portion 110; (a6) placing another of the plurality of sheet portions 130 on the upper part of the spacer portion 140; and (a7) inserting the lower part of the upper punch 121 provided in the punch portion 120 into the mold portion 110.

Referring to FIG. 5A, in (a2), one sheet portion 130 is disposed at the upper part of the lower punch 122 and is disposed at the lowermost position.

Referring to FIG. 5A, in (a3), before placing the spacer portion 140, the thermoelectric material powder TP is supplied to the upper part of one sheet portion 130, so as to allow the thermoelectric material powder TP to surround the spacer portion 140.

Figure 6:
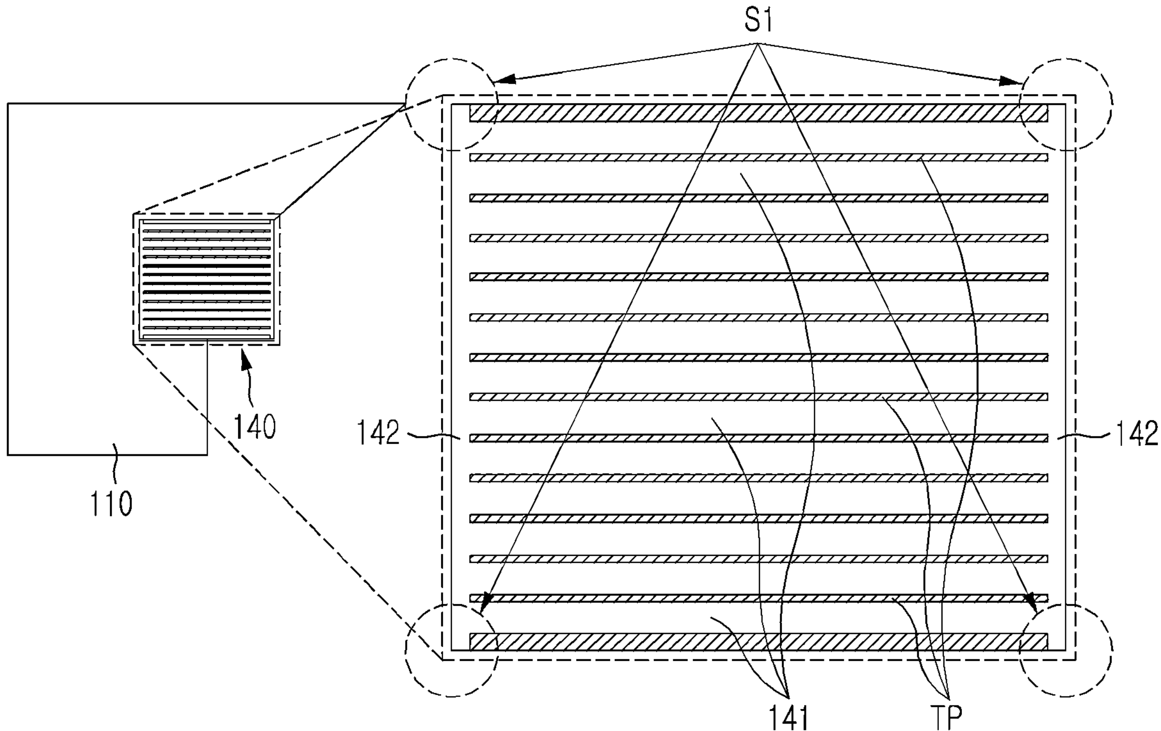
FIG. 6 is a view showing a spacer portion being fixed to an inner surface of a mold portion in a mass-manufacturing method of new structure thermoelectric elements according to second and third embodiments of the disclosure.

FIG. 6 is a view showing a spacer portion being fixed to an inner surface of a mold portion in a mass-manufacturing method of new structure thermoelectric elements according to second and third embodiments of the disclosure.

Referring to FIG. 6, in (a), the spacer portion 140 is fixed in close contact with the inner surface of the mold portion 110 and is supported by the lower punch 122.

Referring to FIG. 5A, in (a4), the spacer portion 140 is disposed on the upper part of the thermoelectric element powder TP disposed at the lower part.

Specifically, in (a4), as shown in FIG. 6, the spacer portion 140 includes a plurality of horizontal spacers 141 that are arranged to extend long in the horizontal direction and spaced apart from each other in the vertical direction, and a pair of vertical spacers 142 that extend long in the vertical direction and formed at ends of the plurality of horizontal spacers, respectively.

Next, referring to FIGS. 5A and 6, in (a5), the thermoelectric material powder TP is supplied into the mold portion 110 to be filled in a plurality of slits formed between a plurality of horizontal spacers 141 and a pair of vertical spacers 142 to surround the spacer portion 140.

Next, referring to FIG. 5A, in (a6), another sheet portion 130 of the plurality of sheet portions 130 is disposed on the spacer portion 140. At this time, the other sheet portion 130 is the sheet portion 130 located in the uppermost position and facing the sheet portion 130 located in the lowermost position.

Referring to FIG. 5B, in (a7), it is ready to pressurize the thermoelectric material powder TP and spacer portion 140 as the lower part of the upper punch 121 is inserted into the mold portion 110.

Next, referring to FIG. 5B, (b) includes: (b1) moving the lower punch 122 upward; (b2) moving the upper punch 121 downward; and (b3) pressurizing by the upper punch 121 and the lower punch 122, the thermoelectric material powder TP and the spacer portion 140.

Next, in (c), the SPS device 200 provides spark plasma to the mold device 100 to sinter the thermoelectric material powder TP, thereby generating the sintered body 140, 150 shown in the upper part of FIG. 3C and FIG. 4F.

Here, the sintered bodies 140 and 150 include the spacer portion 140 and the thermoelectric material portion 150 surrounding the spacer portion 140.

Figure 7:
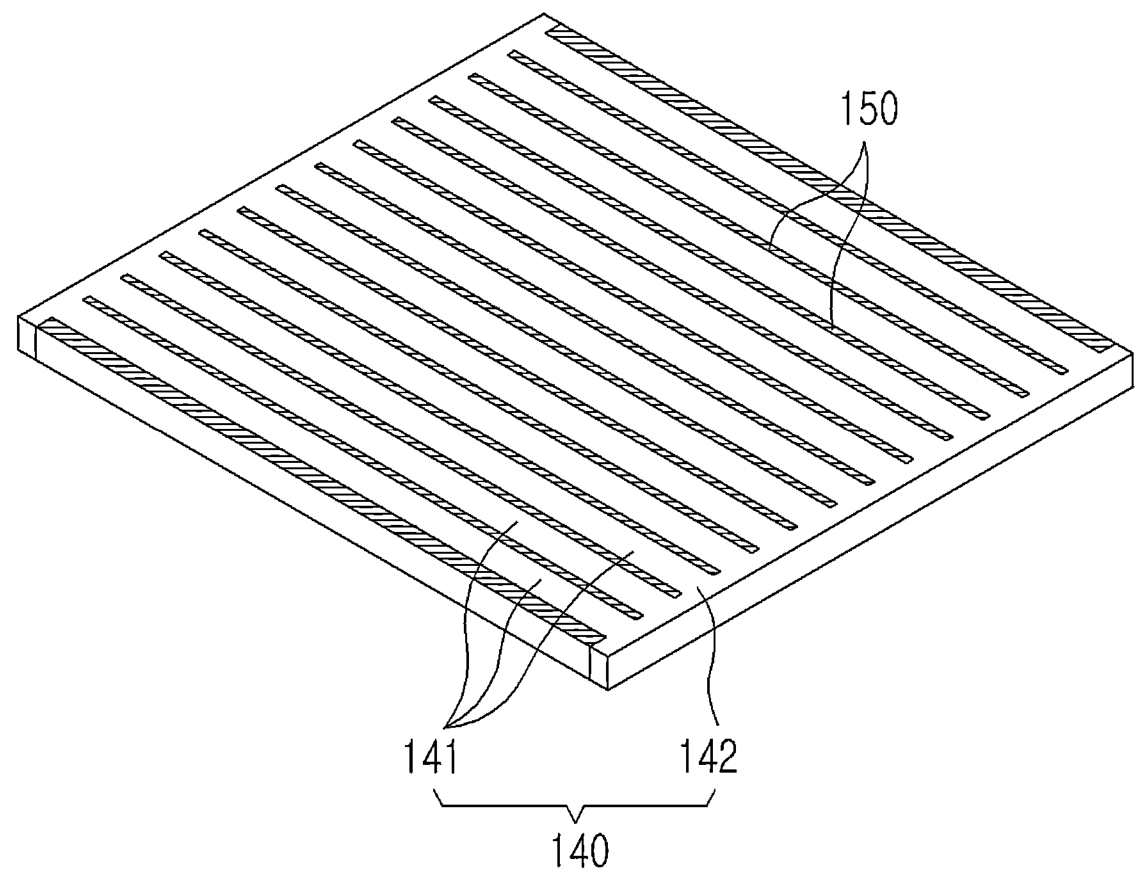
FIG. 7 is a perspective view in one direction showing a sintered body including a thermoelectric element part sintered with a spacer portion and a thermoelectric material powder filled to surround the inner and outer parts of the spacer portion in a mass-manufacturing method of new structure thermoelectric elements according to second and third embodiments of the disclosure.

FIG. 7 is a perspective view in one direction showing a sintered body including a thermoelectric element part sintered with a spacer portion and a thermoelectric material powder filled to surround the inner and outer parts of the spacer portion in a mass-manufacturing method of new structure thermoelectric elements according to second and third embodiments of the disclosure.

Next, the disclosure may further include, between (c) and (d), taking out the sintered body 140, 150 sintered inside the mold portion 110 after the upper punch 121 and the lower punch 122 move upward and downward to be separated from the mold portion 110, and the sintered body 140, 150 separated from the mold portion 110 is illustrated in FIG. 7.

Figure 8:
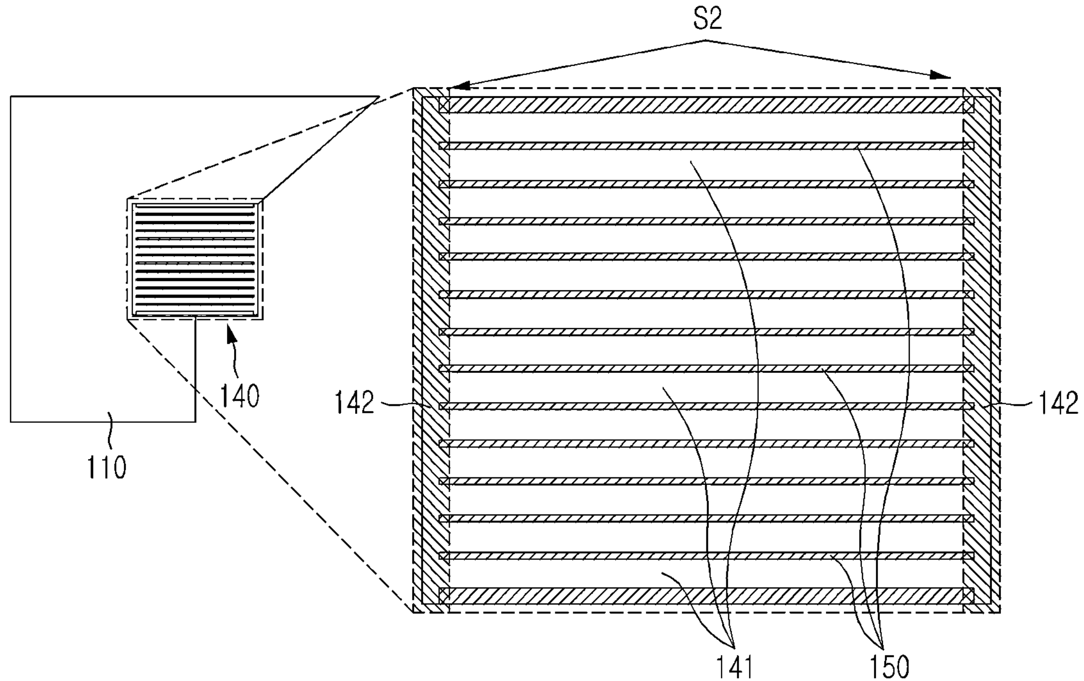
FIG. 8 is a view showing removing both sides of a sintered body including a thermoelectric element part sintered with a spacer portion and a thermoelectric material powder filled to surround the inner and outer parts of the spacer portion in a mass-manufacturing method of new structure thermoelectric elements according to second and third embodiments of the disclosure.

FIG. 8 is a view showing removing both sides of a sintered body including a thermoelectric element part sintered with a spacer portion and a thermoelectric material powder filled to surround the inner and outer parts of the spacer portion in a mass-manufacturing method of new structure thermoelectric elements according to second and third embodiments of the disclosure.

Figure 9:
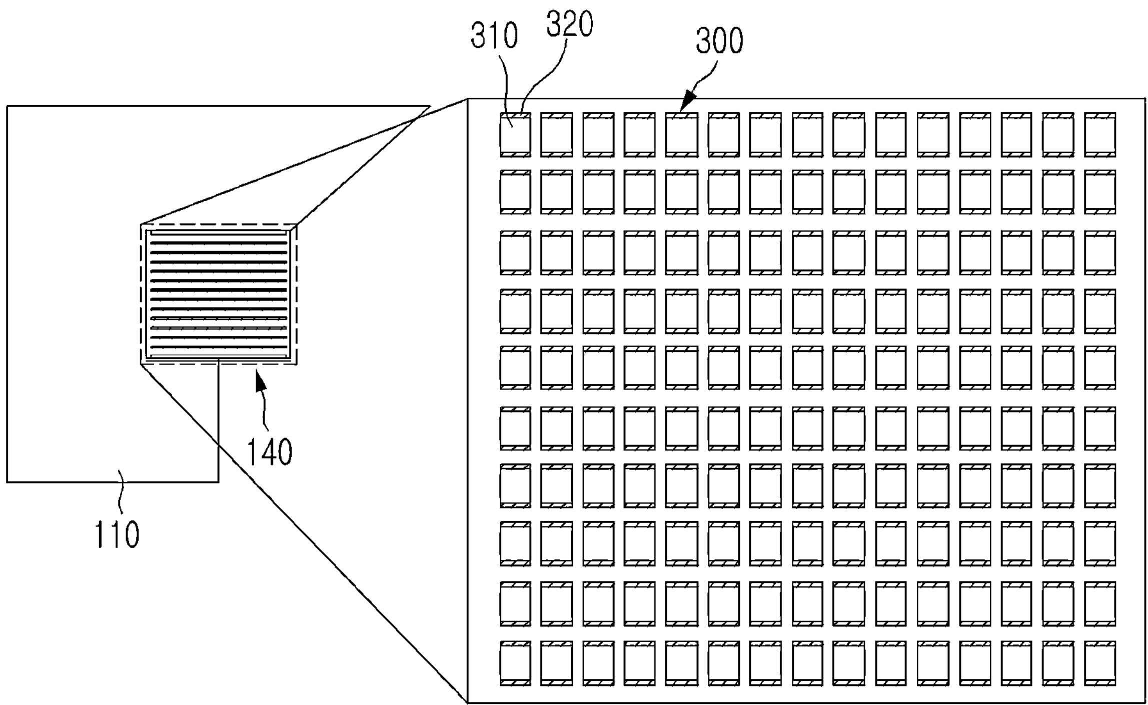
FIG. 9 is a view showing cutting a sintered body formed by a mass-manufacturing method of new structure thermoelectric elements according to second and third embodiments of the disclosure to manufacture a plurality of thermoelectric elements.

FIG. 9 is a view showing cutting a sintered body formed by a mass-manufacturing method of new structure thermoelectric elements according to second and third embodiments of the disclosure to manufacture a plurality of thermoelectric elements.

Figure 10:
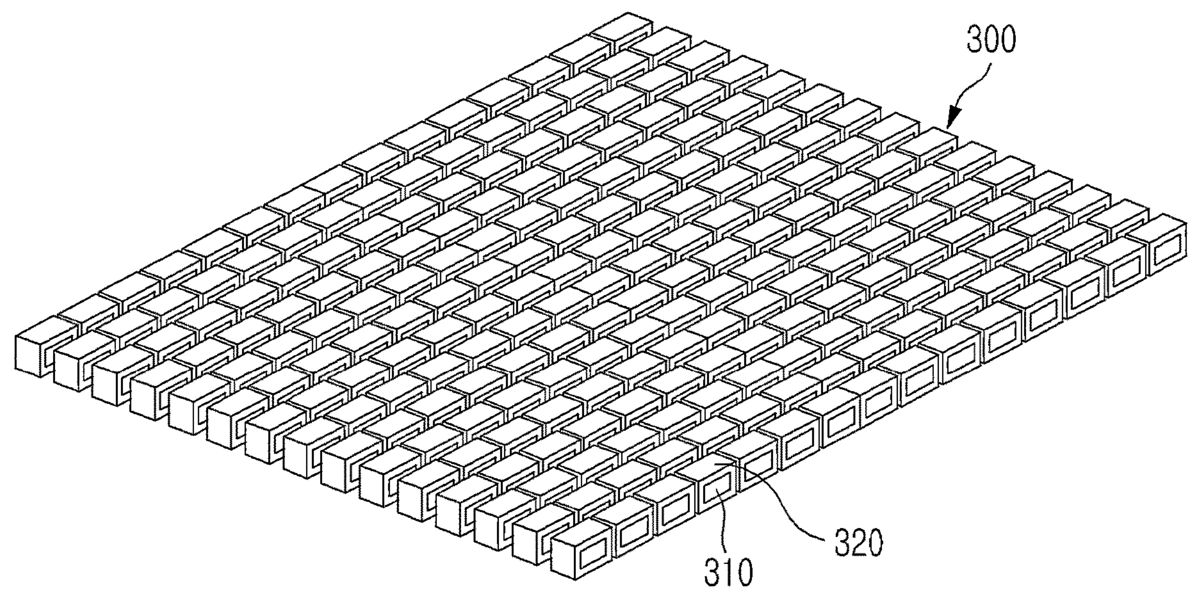
FIG. 10 is a perspective view in one direction showing a plurality of thermoelectric elements manufactured by a mass-manufacturing method of new structure thermoelectric elements according to second and third embodiments of the disclosure.

FIG. 10 is a perspective view in one direction showing a plurality of thermoelectric elements manufactured by a mass-manufacturing method of new structure thermoelectric elements according to second and third embodiments of the disclosure.

Next, referring to FIGS. 8 to 10, (d) includes: (d1) cutting both sides of the sintered body 140, 150 in the vertical direction; (d2) cutting the sintered body 140, 150 in the horizontal direction while maintaining a predetermined gap in the vertical direction; (d3) cutting the sintered body 140, 150 in the vertical direction while maintaining a predetermined gap in the horizontal direction; and (d4) manufacturing the plurality of thermoelectric elements 300.

Referring to FIG. 8, in (d1), both sides of the sintered body 140, 150 are cut in the vertical direction.

Next, referring to FIG. 9, in (d2), the sintered body 140, 150 is cut in the horizontal direction while maintaining a predetermined gap in the vertical direction, and in (d3), the sintered body 140, 150 is cut in the vertical direction while maintaining a predetermined gap in the horizontal direction.

Next, referring to FIG. 10, through (d1) to (d3), the plurality of thermoelectric elements 300 are manufactured in (d4).

1-3. Third Embodiment (Application of Multiple Spacer Portions with Multiple Slits Formed)

Hereinafter, a mass-manufacturing method for new structure thermoelectric elements according to a third embodiment of the disclosure will be described with reference to FIGS. 5A to 12, and a mold device for manufacturing a new structure thermoelectric element and an SPS device including the same will be briefly described.

The third embodiment differs from the second embodiment in that a plurality of spacer portions are composed therein.

The mold device 100 includes a mold portion 110, a punch portion 120, a sheet portion 130, a plurality of spacer portions 140, and a plurality of support portions 160.

The mold device 100 described above is included in an SPS device 200.

Here, the mold portion 110 may be a carbon mold.

The punch portion 120 includes an upper punch 121 and a lower punch 122.

The spacer portion 140 includes a horizontal spacer 141 and a vertical spacer 142.

Figure 11:
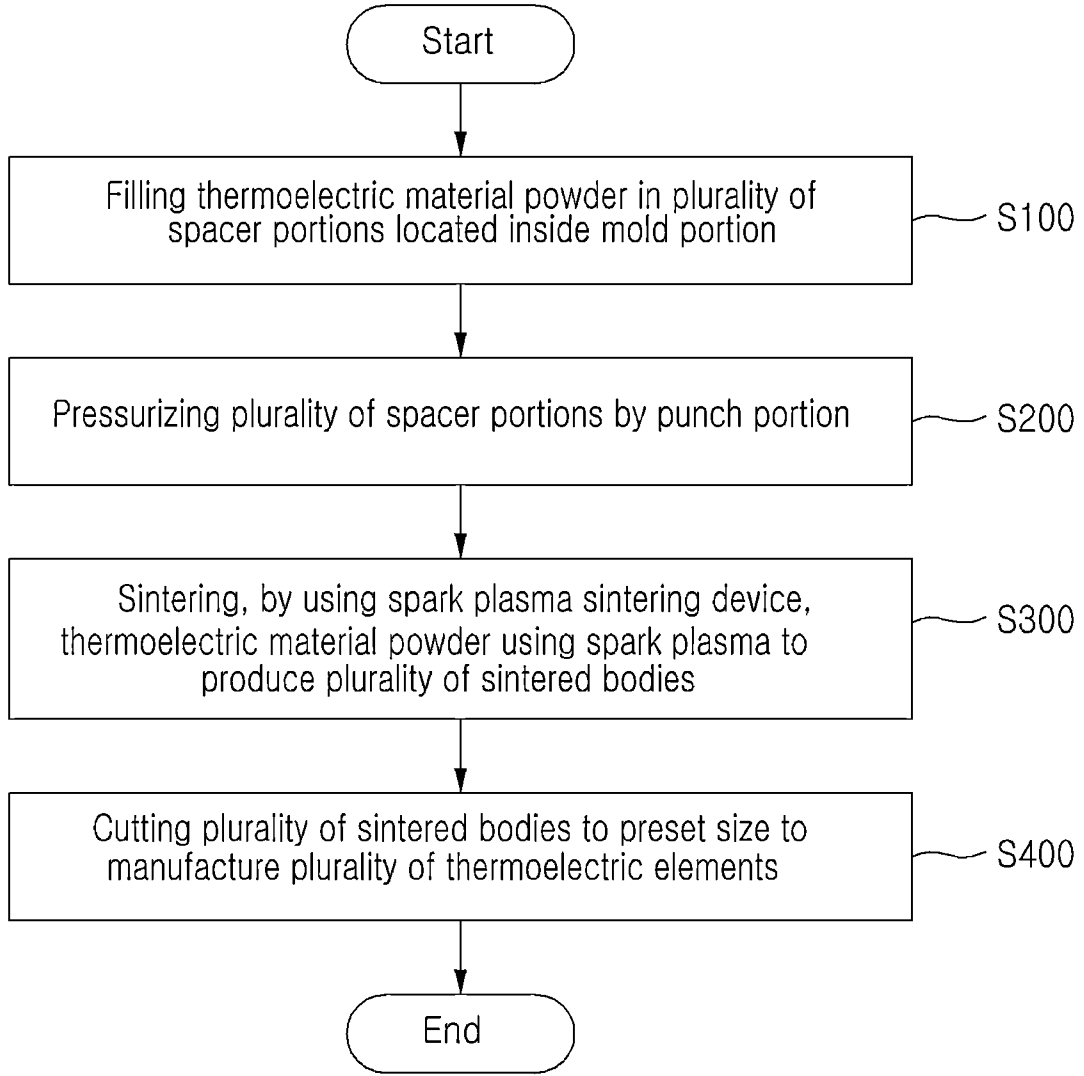
FIG. 11 is a flow chart showing a mass-manufacturing method of new structure thermoelectric elements according to a third embodiment of the disclosure.

FIG. 11 is a flow chart showing a mass-manufacturing method of new structure thermoelectric elements according to a third embodiment of the disclosure.

Referring to FIG. 11, a mass-manufacturing method of new structure thermoelectric elements according to a third embodiment of the disclosure includes: (a) filling a thermoelectric material powder TP in a plurality of spacer portions 130 located inside a mold portion 110 (S100); (b) pressurizing, by a punch portion 120, the plurality of spacer portions 140 (S200); (c) sintering, by a spark plasma sintering device 200, the thermoelectric material powder TP using spark plasma to generate a plurality of sintered bodies 140, 150 (S300); and (d) cutting the plurality of sintered bodies 140, 150 to a preset size to manufacture a plurality of thermoelectric elements.

Figure 12:
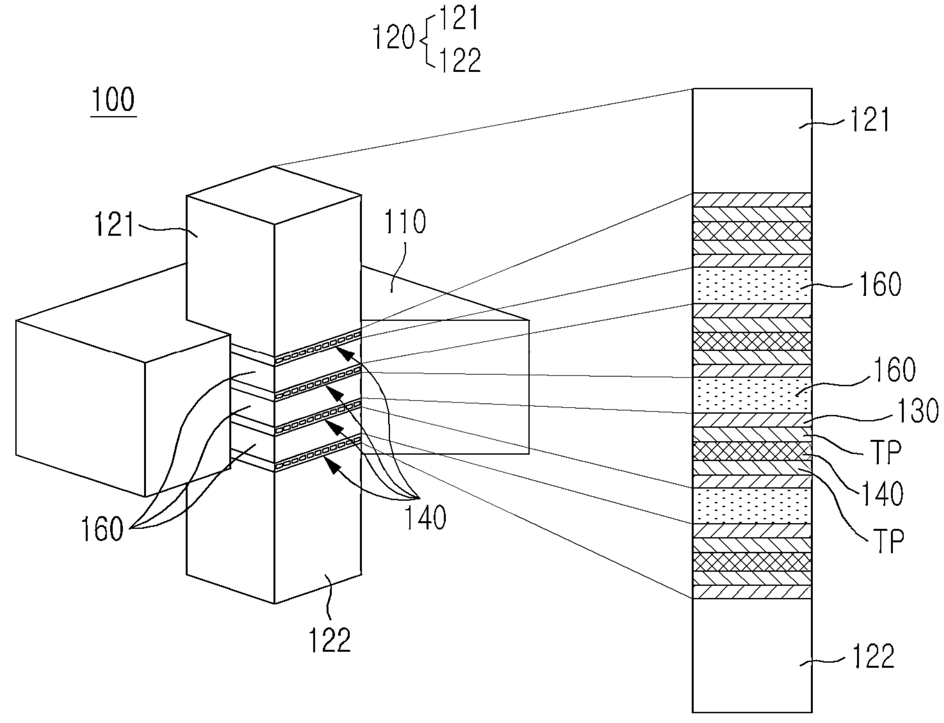
FIG. 12 is a perspective view from one direction showing a mold device for performing a mass-manufacturing method of new structure thermoelectric elements according to a third embodiment of the disclosure.

FIG. 12 is a perspective view from one direction showing a mold device for performing a mass-manufacturing method of new structure thermoelectric elements according to a third embodiment of the disclosure.

Referring to FIG. 12, (a) includes: (a1) supplying the thermoelectric material powder TP into a spacer portion 140 located at the lowermost position after the spacer portion 140 located at the lowermost position among the plurality of spacer portions 140 is located at the upper part of the lower punch 122 provided in the punch portion 120; (a2) supplying the thermoelectric material powder into an n-layer spacer portion 140 after the n-layer spacer portion 140 among the plurality of spacer portions 140 is placed at the upper part of the spacer portion 140 located at the lowermost position; and (a3) supplying the thermoelectric material powder TP into a spacer portion 140 located at the uppermost position after the spacer portion 140 located at the uppermost position among the plurality of spacer portions 140 is placed at the upper part of the n-layer spacer portion 140.

Referring to FIG. 12, (a1) includes: (a11) placing a sheet portion 130 located at the lowermost position among the plurality of sheet portions 130 at the upper part of the lower punch 122; (a12) supplying the thermoelectric material powder TP to the upper part of the sheet portion 130 located at the lowermost position; (a13) placing the spacer portion 140 located at the lowermost position at the upper part of the thermoelectric material powder TP supplied to the upper part of the sheet portion 130 located at the lowermost position; (a14) supplying the thermoelectric material powder TP to the upper part of the spacer portion 140 located at the lowermost position; (a15) placing one sheet portion 130 among the plurality of sheet portions 130 at the upper part of the thermoelectric material powder TP supplied to the upper part of the spacer portion 140 located at the lowermost position; and (a16) placing an n-layer support portion 160 among the plurality of support portions 160 at the upper part of the one sheet portion 130.

Next, referring to FIG. 12, (a2) includes: (a21) placing an n-layer sheet portion 130 among the plurality of sheet portions 130 on the upper part of the n-layer support portion 160; (a22) supplying the thermoelectric material powder TP to the upper part of the n-layer sheet portion 130; (a23) placing an n-layer spacer portion 140 among the plurality of spacer portions 140 on the upper part of the thermoelectric element powder TP supplied to the upper part of the n-layer sheet portion 130; and (a24) supplying the thermoelectric material powder TP to the upper part of the n-layer spacer portion 140.

In particular, (a21) to (a24) are repeatedly performed until a preset number of times becomes n (here, n=natural number).

For example, when n is 1, a first layer support portion 160, a first layer sheet portion 130, a thermoelectric material powder TP, a first layer spacer portion 140, and a thermoelectric material powder TP are laminated in that order.

For example, when n is 2, a second layer support portion 160, a second layer sheet portion 130, a thermoelectric material powder TP, a second layer spacer portion 140, and a thermoelectric material powder TP are laminated in that order.

For example, when n is 3, a third layer support portion 160, a third layer sheet portion 130, a thermoelectric material powder TP, a third layer spacer portion 140, and a thermoelectric material powder TP are laminated in that order.

In the disclosure, as shown in FIG. 12, a case where n is from 1 to 3 is illustrated, and accordingly, in (a2), three sintered bodies 140, 150 are formed, but this is not limited thereto.

That is, since being a natural number, n may be changed and applied as much as a user wants or needs.

Next, (a3) includes: (a31) placing another sheet portion 130 among the plurality of sheet portions 130 on the upper part of the thermoelectric material powder TP supplied to the upper part of the n-layer spacer portion 140; (a32) supplying the thermoelectric material powder TP to the upper part of the other sheet portion 130; (a33) placing a spacer portion 140 located at the uppermost position among the plurality of spacer portions 140 on the upper part of the thermoelectric material powder TP supplied to the upper part of the other sheet portion 130; (a34) supplying the thermoelectric material powder TP to the upper part of the spacer portion 140 located at the uppermost position; (a35) placing a sheet portion 130 located at the uppermost position among the plurality of sheet portions 130 on the upper part of the thermoelectric material powder TP supplied to the upper part of the spacer portion 140 located at the uppermost position; and (a36) placing an upper punch 121 provided in the punch portion 120 on the upper part of the sheet portion 130 located at the uppermost position.

Next, the disclosure may further include, between (c) and (d), taking out the plurality of sintered bodies 140, 150 sintered inside the mold portion 110 after the upper punch 121 and the lower punch 122 provided in the punch portion 120 move upward and downward to be separated from the mold portion 110, and the sintered bodies 140, 150 separated from the mold portion 110 are illustrated in FIG. 7.

Next, referring to FIGS. 8 to 10, (d) includes: (d1) cutting the plurality of sintered bodies 140, 150 in the vertical direction while maintaining a predetermined gap in the vertical direction; (d2) cutting the plurality of sintered bodies 140, 150 in the horizontal direction while maintaining a predetermined gap in the vertical direction; and (d3) manufacturing the plurality of thermoelectric elements 300.

Referring to FIG. 8, in (d1), both sides of the sintered body 140, 150 are cut in the vertical direction.

Next, referring to FIG. 9, in (d2), the sintered body 140, 150 is cut in the horizontal direction while maintaining a predetermined gap in the vertical direction, and in (d3), the sintered body 140, 150 is cut in the vertical direction while maintaining a predetermined gap in the horizontal direction.

Next, referring to FIG. 10, through (d1) to (d3), the plurality of thermoelectric elements 300 are manufactured in (d4).

Figure 13:
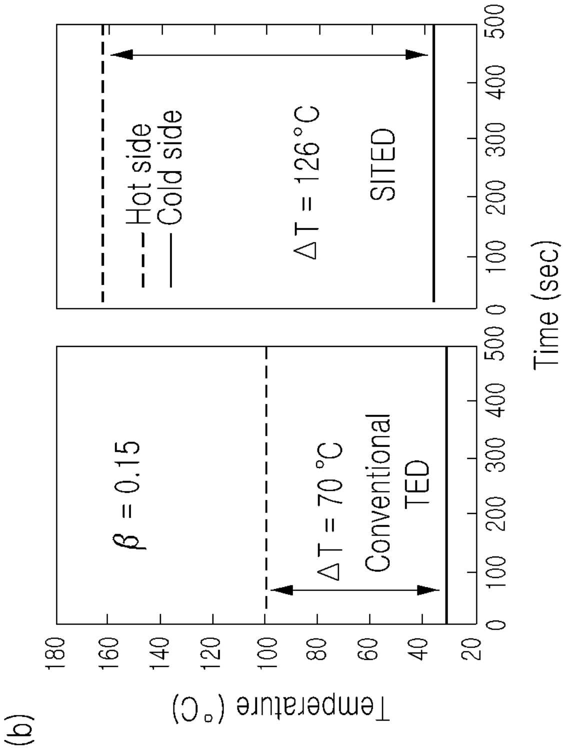
FIG. 13 includes graphs showing the unit cost of power generation and the temperature difference according to the content of a thermoelectric material.
Figure 13:
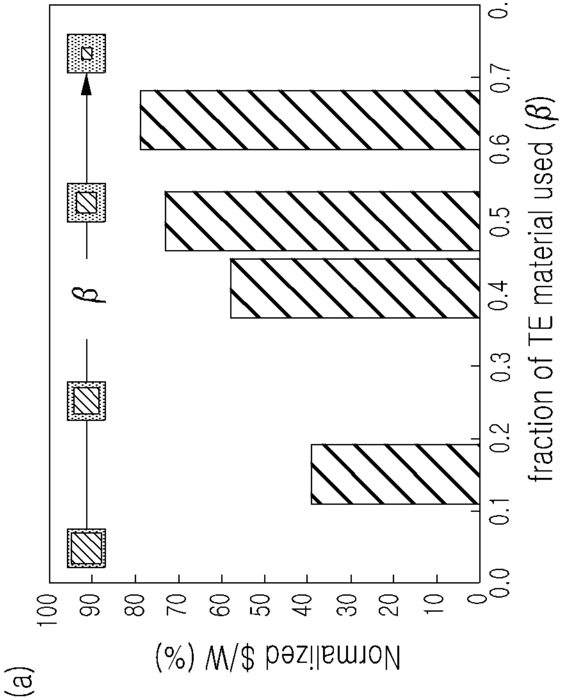

FIGS. 13A and 13B are graphs showing the unit cost of power generation and the temperature difference according to the content of a thermoelectric material.

A new structure thermoelectric element manufactured by a mass-manufacturing method of new structure thermoelectric elements according to first to third embodiments of the disclosure secures a similar level of power generation performance when compared to a conventional thermoelectric element while applying a spacer portion to add a fewer thermoelectric material powder than in the related art.

The content ratio β of the thermoelectric material shown in FIG. 13A is defined as in [Equation 1] below.

[Equation 1]

$$\text{content ratio of thermoelectric material } (\beta) = \frac{(\text{entire region of spacer and thermoelectric material} - \text{region of spacer})}{\text{entire region of spacer and thermoelectric material}}$$

(Here, a spacer and a thermoelectric material are shown in FIG. 4F, FIG. 9, and FIG. 10.)

As shown in FIG. 13A, it is possible to confirm that the unit cost of power generation (Nomalized) increases as the content ratio β of the thermoelectric material increases.

In addition, as shown in FIG. 13B, it is possible to confirm that the temperature difference also increases as the content ratio β of the thermoelectric material increases.

The power generation performance is determined by the electron movement, the Seebeck coefficient, and the temperature difference, wherein a new structure thermoelectric element manufactured by a mass-manufacturing method of new structure thermoelectric elements according to first to third embodiments of the disclosure has lower electron movement than a thermoelectric element of the conventional technology, whereas as the Seebeck coefficient and the temperature difference increase, it is possible to secure similar power generation performance while using a fewer thermoelectric material than the thermoelectric element of the conventional technology.

Figure 14:
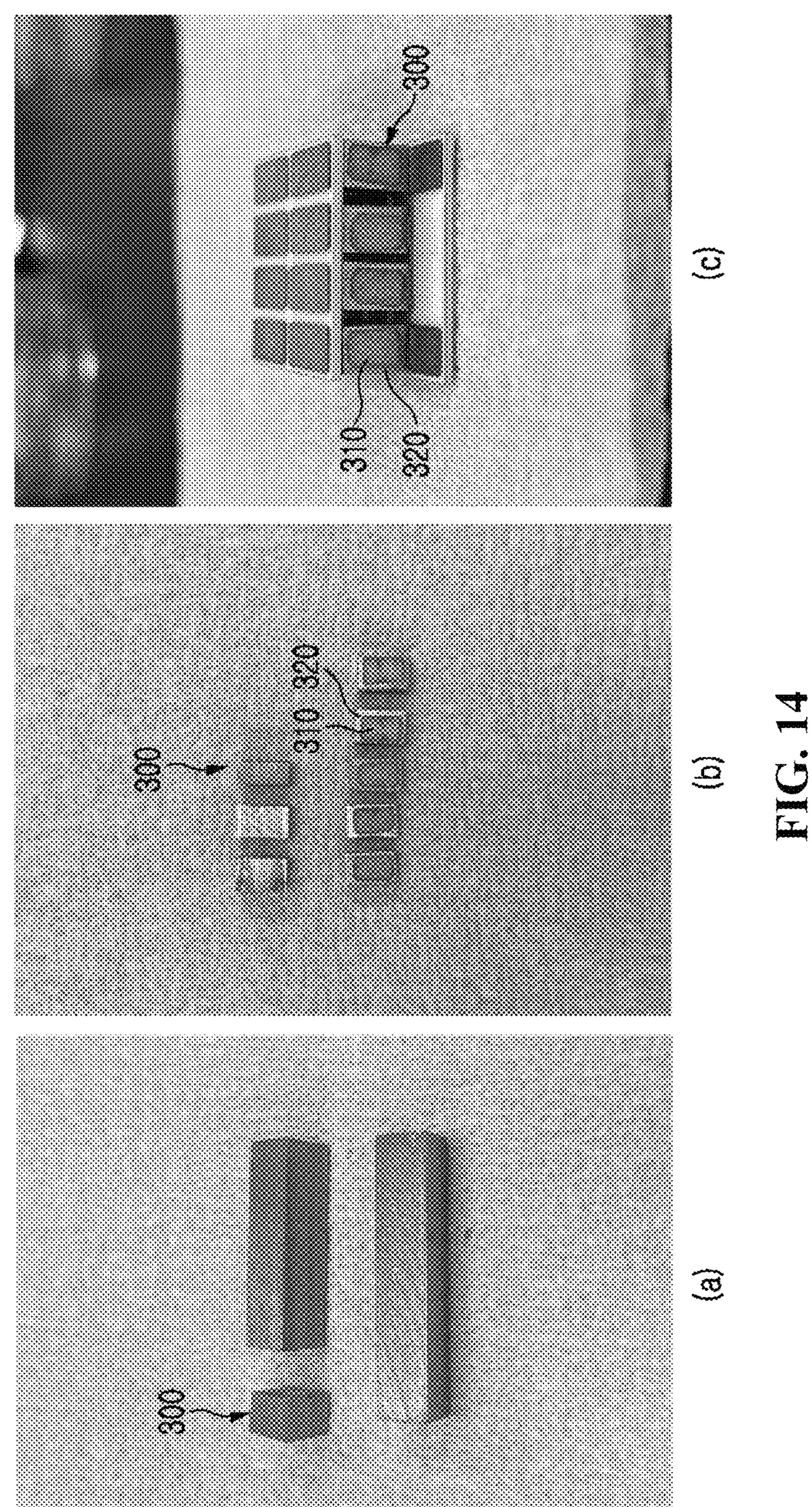
FIG. 14 includes actual photographs showing new structure thermoelectric elements manufactured by a mass-manufacturing method of new structure thermoelectric elements according to first to third embodiments of the disclosure.
Figure 16:
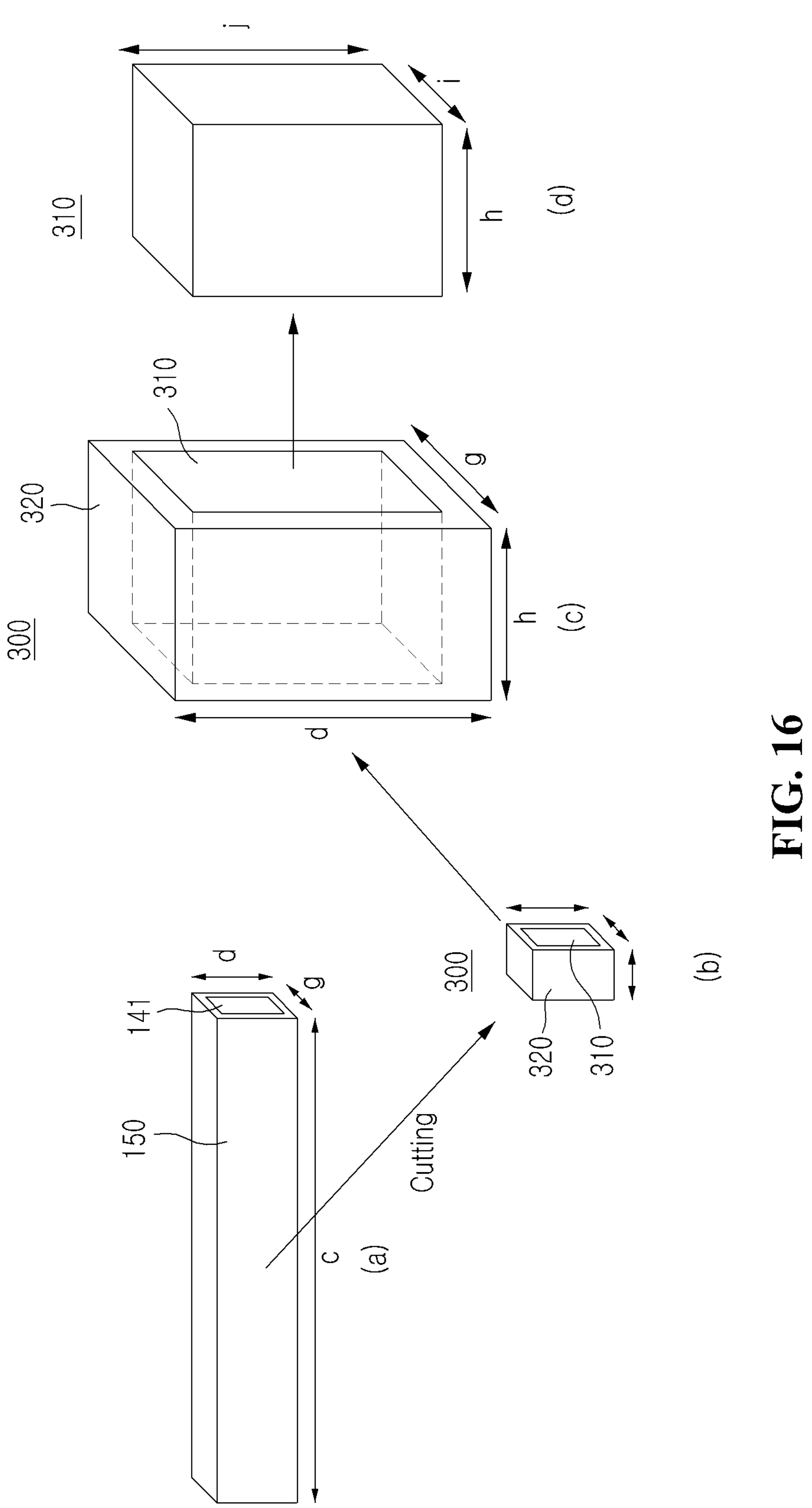
FIG. 16 includes perspective views from one direction showing a plurality of new structure thermoelectric elements cut from FIG. 15.

FIGS. 14A, 14B, and 14C are actual photographs showing new structure thermoelectric elements manufactured by a mass-manufacturing method of new structure thermoelectric elements according to first to third embodiments of the disclosure.

A new structure thermoelectric element actually manufactured by a mass-manufacturing method of new structure thermoelectric elements according to first to third embodiments described above is illustrated in FIGS. 14A, 14B, and 14C.

FIGS. 15A, 15B, and 15C are perspective views from one direction showing the sizes of a sintered body manufactured by a conventional technology and a sintered body manufactured by a mass-manufacturing method of new structure thermoelectric elements according to first to third embodiments of the disclosure.

FIG. 15A is a perspective view from one direction showing the size of a sintered body manufactured by a conventional technology.

In FIG. 15A, the diameter a of the sintered body is 12 cm to 15 cm, the height b of the sintered body is 2 cm to 3 cm, and the weight of the sintered body is 2 kg to 2.5 kg.

FIG. 15B is a perspective view in one direction showing the size of a sintered body manufactured by a mass-manufacturing method of new structure thermoelectric elements according to a second embodiment of the disclosure.

In FIG. 15B, the horizontal length c of the sintered body is 3 cm, the height d of the sintered body is 0.6 cm, and the weight of the sintered body is 0.004 kg.

FIG. 15C is a perspective view in one direction showing the size of a sintered body manufactured by a mass-manufacturing method of new structure thermoelectric elements according to a third embodiment of the disclosure.

In FIG. 15C, the horizontal length c of the sintered body is 8.5 cm, the vertical length of the sintered body is 7.8 cm, the height of the sintered body is 0.4 cm, and the length d of the sintered body cut in the horizontal direction is 0.6 cm.

In addition, the circle illustrated in FIG. 15C is a sintered body manufactured by the conventional technology described in FIG. 15A.

Looking at FIG. 15C, even if only a simple cross-sectional area is considered, the second embodiment of the disclosure may produce about 273 new structure thermoelectric elements at one time using an SPS device.

Here, the size of the new structure thermoelectric elements is 4 mm×4 mm×6 mm.

2. New Structure Thermoelectric Elements (300) Manufactured by Mass-Manufacturing Method of New Structure Thermoelectric Elements FIGS. 16A, 16B, 16C, and 16D are perspective views from one direction showing a plurality of new structure thermoelectric elements cut from FIG. 15B.

A new structure thermoelectric element 300 according to first to third embodiments of the disclosure includes a spacer 310 and a thermoelectric material 320 in a new structure thermoelectric element manufactured by a mass-manufacturing method of new structure thermoelectric elements according to the first to third embodiments described above.

In FIG. 16A, a sintered body 141, 150 is illustrated, and when the sintered body 141, 150 is cut, a new structure thermoelectric element 300 illustrated in FIG. 16B is formed.

Referring to FIG. 16A, the sintered body 141, 150 includes a horizontal spacer 141 and a thermoelectric element portion 150.

Specifically, the horizontal length c of the sintered body 14, 150 is 3 cm, the vertical length d of the sintered body 14, 150 is 0.4 cm, and the height d of the sintered body 141, 150 is 0.6 cm. One new structure thermoelectric element 300 among a plurality of new structure thermoelectric elements formed by cutting the above-mentioned sintered body 141, 150 is illustrated in (b) of FIG. 16.

Referring to FIGS. 16B, 16C, and 6D, the spacer 310 may have a hexahedral shape.

Specifically, the horizontal length h of the spacer 310 is 0.4 cm, the vertical length i of the spacer 310 is 0.3 cm, and the height j of the spacer 310 is 0.5 cm.

Two facing faces of the spacer 310 are exposed to the outside.

A thermoelectric material 320 is formed to surround four faces of the six faces of the spacer 310 except the two facing faces.

Specifically, the horizontal length h of the thermoelectric material 320 is 0.4 cm, the vertical length g of the thermoelectric material 320 is 0.4 cm, and the height d of the thermoelectric material 320 is 0.6 cm.

As described above, the disclosure may mass-manufacture thermoelectric elements in one process using an SPS device, compared to the conventional technology.

The description of the disclosure described above is for illustrative purposes, and those skilled in the art will understand that the disclosure is easily modifiable into other specific forms without changing the technical idea or essential features of the disclosure. Therefore, the embodiments described above should be understood in all respects as illustrative and not restrictive. For example, each component described as single may be implemented in a distributed manner, and similarly, components described as distributed may also be implemented in a combined form.

The scope of the disclosure is indicated by the claims described below, and all changes or modified forms derived from the meaning and scope of the claims and their equivalent concepts should be construed as being included in the scope of the disclosure.

EXPLANATION OF REFERENCE NUMERALS

10: Molding portion
11: Molding
12: Punch
12*a*: First punch
12*b*: Second punch
13: Sheet
13*a*: Upper sheet
13*b*: Lower sheet
14: Spacer
100: Mold device
110: Mold portion
120: Punch portion
121: Upper punch
122: Lower punch
130: Sheet portion
140: Spacer portion
141: Horizontal spacer
142: Vertical spacer
150: Thermoelectric material portion
160: Support portion
TP: Thermoelectric material powder
200: SPS device
300: New structure thermoelectric element
310: Spacer
320: Thermoelectric material

What is claimed is:

1. A manufacturing method of thermoelectric elements, the manufacturing method comprising:

filling a thermoelectric material powder to surround inner and outer parts of a plurality of spacer portions disposed inside a mold portion;

pressurizing, by a punch portion, the plurality of spacer portions;

sintering, by a spark plasma sintering device, the thermoelectric material powder using spark plasma to generate a plurality of sintered bodies; and cutting the plurality of sintered bodies to a preset size to manufacture a plurality of thermoelectric elements, wherein the filling the thermoelectric material powder comprises:

supplying the thermoelectric material powder into a spacer portion disposed at a lowermost position after the spacer portion disposed at the lowermost position among the plurality of spacer portions is disposed at an upper part of a lower punch disposed in the punch portion;

supplying the thermoelectric material powder into an n-layer spacer portion after the n-layer spacer portion among the plurality of spacer portions is placed at an upper part of the spacer portion disposed at the lowermost position; and supplying the thermoelectric material powder into a spacer portion disposed at an uppermost position after the spacer portion disposed at the uppermost position among the plurality of spacer portions is placed at an upper part of the n-layer spacer portion, and wherein the supplying the thermoelectric material powder into the spacer portion disposed at the lowermost position comprises:

placing a sheet portion disposed at the lowermost position among a plurality of sheet portions at the upper part of the lower punch;

supplying the thermoelectric material powder to the upper part of the sheet portion disposed at the lowermost position;

placing the spacer portion disposed at the lowermost position at an upper part of the thermoelectric material powder supplied to the upper part of the sheet portion disposed at the lowermost position;

supplying the thermoelectric material powder to the upper part of the spacer portion disposed at the lowermost position;

placing one sheet portion among the plurality of sheet portions at the upper part of the thermoelectric material powder supplied to the upper part of the spacer portion disposed at the lowermost position; and placing an n-layer support portion among a plurality of support portions at an upper part of the one sheet portion.

2. The manufacturing method of claim 1, wherein the supplying the thermoelectric material powder into the n-layer spacer portion comprises:

placing an n-layer sheet portion among the plurality of sheet portions on an upper part of the n-layer support portion;

supplying the thermoelectric material powder to an upper part of the n-layer sheet portion;

placing the n-layer spacer portion among the plurality of spacer portions on an upper part of thermoelectric element powder supplied to the upper part of the n-layer sheet portion; and supplying the thermoelectric material powder to the upper part of the n-layer spacer portion, wherein steps from the placing the n-layer sheet portion to the supplying the thermoelectric material powder are repeatedly performed until a preset number of times becomes n, and the n is a natural number.

3. The manufacturing method of claim 2, wherein the supplying the thermoelectric material powder into the spacer portion disposed at the uppermost position comprises:

placing another sheet portion among the plurality of sheet portions on the upper part of the thermoelectric material powder supplied to the upper part of the n-layer spacer portion;

supplying the thermoelectric material powder to an upper part of the another sheet portion;

placing the spacer portion disposed at the uppermost position among the plurality of spacer portions on the upper part of the thermoelectric material powder supplied to the upper part of the another sheet portion;

supplying the thermoelectric material powder to an upper part of the spacer portion disposed at the uppermost position;

placing a sheet portion disposed at the uppermost position among the plurality of sheet portions on the upper part of the thermoelectric material powder supplied to the upper part of the spacer portion disposed at the uppermost position; and placing an upper punch provided in the punch portion on an upper part of the sheet portion disposed at the uppermost position.

4. The manufacturing method of claim 1, further comprising, between the sintering the thermoelectric material powder and the cutting the plurality of sintered bodies, taking out the plurality of sintered bodies sintered inside the mold portion after an upper punch and the lower punch provided in the punch portion move upward and downward to be separated from the mold portion.

5. The manufacturing method of claim 1, wherein the cutting the plurality of sintered bodies comprises:

cutting both sides of the plurality of sintered bodies in a vertical direction;

cutting the plurality of sintered bodies in a horizontal direction while maintaining a predetermined gap in the vertical direction;

cutting the plurality of sintered bodies in the vertical direction while maintaining a predetermined gap in the horizontal direction; and manufacturing the plurality of thermoelectric elements.

* * * * *